(12) United States Patent
Radosavljevic et al.

(10) Patent No.: US 10,847,624 B2
(45) Date of Patent: Nov. 24, 2020

(54) METHODS AND APPARATUS TO FORM GAN-BASED TRANSISTORS DURING BACK-END-OF-THE-LINE PROCESSING

(71) Applicant: Intel Corporation, Santa Clara, CA (US)

(72) Inventors: Marko Radosavljevic, Portland, OR (US); Sansaptak Dasgupta, Hillsboro, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/321,353

(22) PCT Filed: Sep. 27, 2016

(86) PCT No.: PCT/US2016/053976
§ 371 (c)(1),
(2) Date: Jan. 28, 2019

(87) PCT Pub. No.: WO2018/063160
PCT Pub. Date: Apr. 5, 2018

(65) Prior Publication Data
US 2019/0181231 A1 Jun. 13, 2019

(51) Int. Cl.
*H01L 29/20* (2006.01)
*H01L 21/8238* (2006.01)
(Continued)

(52) U.S. Cl.
CPC .... *H01L 29/2003* (2013.01); *H01L 21/76898* (2013.01); *H01L 21/8258* (2013.01);
(Continued)

(58) Field of Classification Search
CPC .......... H01L 29/2003; H01L 21/76898; H01L 21/823807; H01L 21/8258; H01L 27/0605;
(Continued)

(56) References Cited

U.S. PATENT DOCUMENTS

2003/0020090 A1 1/2003 Heck et al.
2006/0049409 A1 3/2006 Rafferty et al.
(Continued)

FOREIGN PATENT DOCUMENTS

WO 2018063160 4/2018

OTHER PUBLICATIONS

International Searching Authority, "International Search Report", dated Jun. 7, 2017 in connection with International Application No. PCT/US2016/053976, 4 pages.
(Continued)

*Primary Examiner* — Tu-Tu V Ho
(74) *Attorney, Agent, or Firm* — Green, Howard & Mughal LLP

(57) ABSTRACT

Methods and apparatus to form GaN-based transistors during back-end-of-line processing are disclosed. An example integrated circuit includes a first transistor formed on a first semiconductor substrate. The example integrated circuit includes a dielectric material formed on the first semiconductor substrate. The dielectric material extends over the first transistor. The example integrated circuit further includes a second semiconductor substrate formed on the dielectric material. The example integrated circuit also includes a second transistor formed on the second semiconductor substrate.

21 Claims, 4 Drawing Sheets

(51) Int. Cl.
*H01L 21/8258* (2006.01)
*H01L 27/06* (2006.01)
*H01L 27/092* (2006.01)
*H01L 27/12* (2006.01)
*H01L 21/768* (2006.01)
*H01L 23/48* (2006.01)

(52) U.S. Cl.
CPC .. *H01L 21/823807* (2013.01); *H01L 27/0605* (2013.01); *H01L 27/0688* (2013.01); *H01L 27/092* (2013.01); *H01L 27/1207* (2013.01); *H01L 27/1218* (2013.01); *H01L 27/1225* (2013.01); *H01L 23/481* (2013.01)

(58) Field of Classification Search
CPC ............... H01L 27/0688; H01L 27/092; H01L 27/1207; H01L 27/1218; H01L 27/1225; H01L 23/481
USPC .......................................................... 257/76
See application file for complete search history.

(56) References Cited

U.S. PATENT DOCUMENTS

| | | | |
|---|---|---|---|
| 2012/0107967 A1* | 5/2012 | Or-Bach | H03K 17/687 438/4 |
| 2015/0060862 A1 | 3/2015 | Lim et al. | |
| 2015/0280010 A1 | 10/2015 | Shieh et al. | |
| 2016/0111369 A1 | 4/2016 | Or-Bach et al. | |
| 2016/0315113 A1* | 10/2016 | Mao | H01L 27/14636 |
| 2016/0336416 A1* | 11/2016 | Liang | H01L 29/42364 |

OTHER PUBLICATIONS

International Searching Authority, "Written Opinion of the International Search Authority", dated Jun. 7, 2017 in connection with International Application No. PCT/US2016/053976, 9 pages.

* cited by examiner

METHODS AND APPARATUS TO FORM GaN-BASED TRANSISTORS DURING BACK-END-OF-THE-LINE PROCESSING

FIELD OF THE DISCLOSURE

This disclosure relates generally to semiconductors and, more particularly, to methods and apparatus to form GaN-based transistors during back-end-of-line processing.

BACKGROUND

Gallium nitride (GaN) is a semiconductor material that has a relatively wide bandgap. For example, traditional semiconductor materials such as silicon (Si) and gallium arsenide (GaAs) have a bandgap on the order of approximately 1 to 1.5 electronvolts. By contrast, GaN has a bandgap of approximately 3.4 electronvolts. The relatively high bandgap results in a relatively high breakdown voltage that makes GaN suitable as a substrate for transistors used in high power and/or high frequency applications. However, the nature of GaN is such that the benefits only exist for n-channel transistors while p-channel transistors formed on a GaN substrate exhibits characteristics that are too poor to be acceptable in most applications.

Figure 1:
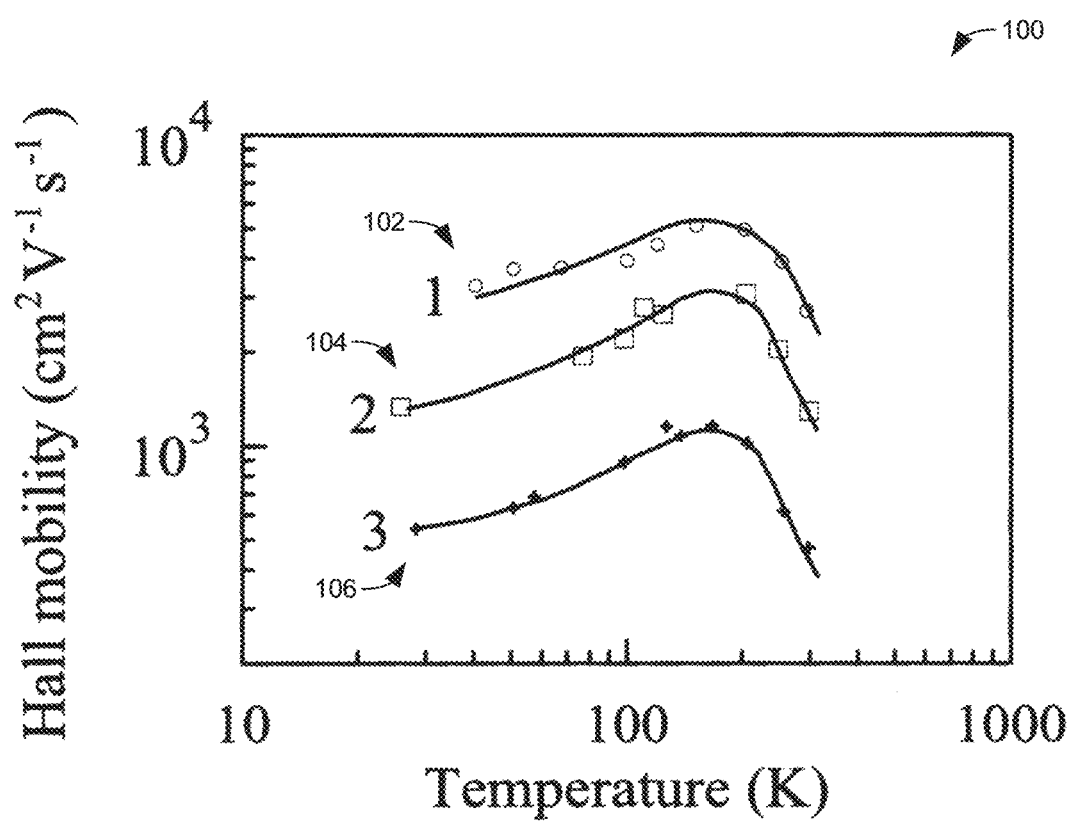
FIG. 1 is a graph representing the electron Hall mobility versus temperature of three different doping densities of InN.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Power efficiency is an important consideration in many electronic devices. This is especially a concern in mobile devices that rely on a battery to power electrical components. As such, efforts have been made to use nitride based semiconductor materials in integrated circuits (ICs) because they have been shown to exhibit better power efficiency in particular applications including voltage regulation and radio frequency (RF) power amplification than other commonly used semiconductor materials. More particularly, gallium nitride (GaN) used as a semiconductor substrate shows significant benefits over semiconductor substrates made of silicon (Si) or gallium arsenide (GaAs). These benefits are largely due to a significantly higher bandgap in GaN than in other semiconductor materials, which results in a much higher breakdown voltage. However, due to the band structure of GaN, the improved efficiency of GaN-based semiconductor materials only applies to n-channel devices with GaN-based p-channel devices having particularly poor performance characteristics.

The implementation of voltage regulators and RF power amplifiers both require n-channel and p-channel control logic. Thus, while a GaN substrate may be beneficial to form high voltage NMOS transistors (n-channel metal-oxide-semiconductor field-effect transistors), a different semiconductor substrate is needed to form the PMOS transistors (p-channel metal-oxide-semiconductor field-effect transistors) to avoid the poor characteristics of GaN for such p-channel devices. While Si has desirable performance characteristics for PMOS transistors, there are challenges to integrating an Si substrate with a GaN substrate to enable the electrical interconnection of the NMOS and PMOS transistors. Among other things, there is a mismatch in the lattice structures of GaN and Si. As a result, for GaN to be properly formed and processed on a Si wafer, the Si wafer needs to be oriented with the surface along the <111> crystal lattice plane. However, this orientation of Si makes the processing of the Si more difficult than when the Si is oriented with the top surface along the <100> crystal lattice plane in many typical applications. Furthermore, even with the orientation of the Si noted above, the different lattice structures results in the need for a relatively thick epitaxial layer of GaN formed on an Si substrate. The significant height difference between the top surface of the GaN substrate surface and the top surface of the Si surface resulting from the thick GaN layer makes it difficult and/or costly for transistors formed on each surface (e.g., NMOS transistors on the GaN and PMOS transistors on the Si) to be electrically interconnected.

An alternate approach is to manufacture separate chips on separate wafers, each having a different substrate material. For example, one chip is formed with GaN as the substrate for the NMOS transistors and another chip is formed with Si as the substrate for the PMOS transistors. After fabrication of the separate chips, the chips are electrically interconnected via solder bumps on one chip being received at connection points in the other chip. This approach is costly and time consuming because the separate chips must be fabricated during separate processes.

The teachings disclosed herein enable the co-integration of PMOS transistors formed on a Si substrate with high voltage NMOS transistors formed on a GaN-based substrate that are developed as part of a single chip (e.g., on a single wafer). This is made possible by forming the GaN-based transistors during the back-end-of-line of device fabrication. Generally speaking, semiconductor device fabrication can be broadly separated into two sequential phases including (1) front-end-of-line (FEOL) processing, and (2) back-end-of-line (BEOL) processing. FEOL processing typically involves the formation of individual transistors on a semiconductor substrate (e.g., a silicon wafer). BEOL processing involves the formation of metal wiring to interconnect the transistors previously formed on the substrate. Thus, as explained more fully below, in some examples, GaN-based substrates are formed during the BEOL after at least some metal wiring has been formed to interconnect the transistors previously formed in the Si substrate during the FEOL.

More particularly, examples disclosed herein begin with a standard Si wafer that is used to form the PMOS transistors during the FEOL as is known by persons of ordinary skill in the art. However, unlike known approaches, rather than forming a GaN layer on the Si wafer during the FEOL to form the desired NMOS transistors, the GaN substrate (and the associated transistors) is formed during the BEOL phase of the chip fabrication after at least some of the metal wiring has been formed for the PMOS transistors on the Si substrate. That is, after the PMOS transistors are formed on the Si substrate (generally corresponding to the end of the FEOL phase), one or more layers of metal wiring and dielectric material are added over top of the PMOS transistors and Si substrate. Thereafter, a layer of GaN is formed on the dielectric material to serve as the substrate for NMOS transistors that are electrically interconnected with the metal wiring already connected to the PMOS transistors of the Si substrate. Thus, in some examples, the GaN substrate and the associated NMOS transistors are positioned above the Si substrate and the associated PMOS transistors. Not only does the stacking of transistors in this manner enable the transistors of different materials to be electrically interconnected on a single chip, it also reduces the overall footprint of the electrical circuit. That is, forming transistors during the BEOL enables such transistors to overlap transistors formed during the FEOL to increase the number of transistors that may be formed on a single semiconductor wafer (e.g., on the same chip). In some examples, more than one layer of transistors may be formed during the BEOL to increase transistor count even further.

Forming transistors during the BEOL phase of chip fabrication rather than during the FEOL phase, as is typically done, includes several challenges. Generally speaking, relatively stringent requirements are typically followed during FEOL processing (in terms of the materials that may be used) to avoid contamination of the semiconductor material in which transistors are formed. However, there are relatively few limitations in the types of methods available to deposit, pattern, remove, or otherwise modify the materials involved in the formation of transistors during the FEOL. By contrast, while contamination is less of a concern during BEOL processing because the transistors have typically already been formed, the types of processes available to form the metalization layer (e.g., the metal wiring to interconnect separate transistors) during the BEOL are relatively limited. In particular, the BEOL is typically limited to processes that do not exceed temperatures of around 400° C. because the BEOL materials (e.g., the metal wiring) begin to degrade at higher temperatures. This is one reason that the formation of transistors (during the FEOL) is typically completed before moving onto the BEOL when metallic interconnects are formed.

There are relatively few semiconductor materials that can be formed within the relatively limited temperature range of BEOL processing (e.g., not exceeding about 400° C.) that still have suitable characteristics to form transistors. One such material is Indium nitride (InN), which is capable of being formed at temperatures below 400° C. using plasma molecular beam epitaxy (MBE) and $NH_3$-MBE beam epitaxy. InN grown at such temperatures is a semiconductor characterized by an electron Hall mobility that is comparable with semiconductors made of Si. For example, FIG. 1 is a graph 100 representing the electron Hall mobility versus temperature of three different doping densities of InN. More particularly, a first plotted line 102 represents InN at a doping density of $5.1e16$ $cm^{-3}$, a second plotted line 104 represents InN at a doping density of $8.7e16$ $cm^{-3}$, and a third plotted line 106 represents InN at a doping density of $3.9e17$ $cm^{-3}$. By comparison, Si at a doping density of $1.3e17$ per cubic centimeter exhibits a Hall mobility ranging between approximately 1000 and 1400 $cm^2V^{-1}s^{-1}$ over a similar temperature range of that shown in the graph 100 of FIG. 1. Thus, the speed performance of InN-based semiconductor materials can be expected to be comparable to Si.

In accordance with the teachings of this disclosure, GaN may be mixed with InN to form the alloy of indium gallium nitride (InGaN) that is used as a substrate to form NMOS transistors during the BEOL processing of a Si wafer with PMOS transistors already formed thereon (during the FEOL). The InGaN can be grown at a temperature within a range acceptable for BEOL processing (e.g., below about 400° C.) due to the InN in the alloy. Furthermore, the InGaN has a relatively high bandgap (due to the GaN in the alloy) to achieve better power efficiency when used for voltage regulation and RF power amplification.

Figure 2:
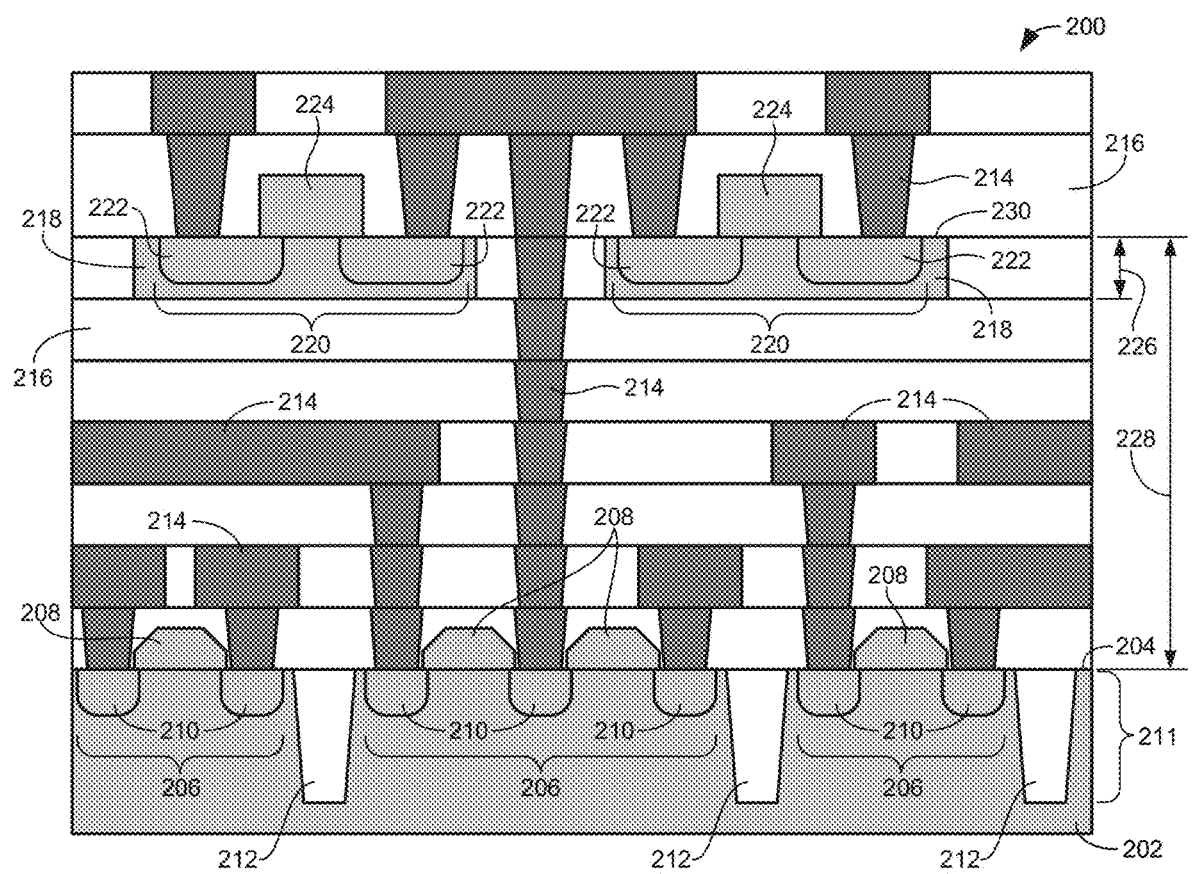
FIG. 2 illustrates a cross-sectional view of a portion of an example integrated circuit constructed in accordance with the teachings of this disclosure.

FIG. 2 illustrates a cross-sectional view of a portion of an example integrated circuit 200 constructed in accordance with the teachings of this disclosure. In the illustrated example, the circuit 200 is formed on a Si substrate 202. In some examples, the Si substrate 202 is a typical Si wafer (e.g., 300 mm Si CMOS (complementary metal-oxide-semiconductor) wafer with a top surface 204 oriented along the <100> crystal lattice plane). As shown in the illustrated example, one or more transistors 206 are formed on the top surface 204 of the Si substrate 202. The transistors 206 may be of any suitable design. In the illustrated example, the transistors 206 include a gate 208 positioned between doped regions 210 of the Si substrate 202 corresponding to the sources and drains of the transistors 206. In the illustrated example, the doped regions 210 are within a fin 211 (e.g., extending across the illustrated example of FIG. 2) formed of the Si substrate 202 that is divided along its length by trenches 212 of shallow trench isolation (STI) material (e.g., silicon dioxide ($SiO_2$), silicate ($SiO_4$), or other dielectric). Typically, formation of the fin 211 for the transistors 206, the gates 208, the doped regions 210, and the STI trenches 212 constitutes the FEOL phase of the fabrication process, whereas the material added thereafter is considered to be associated with the BEOL phase.

During the BEOL phase of semiconductor device fabrication, the individual transistors 206 are electrically interconnected to complete the circuit 200 by forming metal wiring 214 connecting the sources and drains (e.g., the doped regions 210) of particular transistors 206. Typically, the formation of the metal wiring 214 is accomplished by forming a series of layers of a dielectric material 216 over the transistors 206 and Si substrate 202 and depositing metal within holes and/or vias made in each layer of the dielectric material 216 after it is formed. The dielectric material 216 may be any suitable insulator such as an oxide or a nitride. More particularly, the dielectric material 216 may be silicon dioxide ($SiO_2$), silicate ($SiO_4$), silicon oxynitride (SiON), etc. The metal wiring 214 may be any suitable metal (e.g., aluminum (Al), copper (Cu), etc.).

In the illustrated example of FIG. 2, a layer of InGaN 218 is formed on one of the layers of the dielectric material 216 above the transistors 206 formed on the Si substrate 202. The InGaN 218 is used as a substrate for additional transistors 220. In some examples, the transistors 220 formed on the InGaN 218 are NMOS transistors while the transistors 206 formed on the Si substrate 202 are PMOS transistors. Such NMOS transistors formed on a GaN-based substrate have significantly better efficiency than similar NMOS transistors formed on a Si substrate in applications associated with voltage regulation on RF power amplification. Thus, the integrated circuit 200 represented in FIG. 2 will be more efficient than a comparable circuit using a similar arrangement of transistors exclusively formed on the Si substrate 202. Furthermore, the stacking of the NMOS transistors 220 on top of the PMOS transistors 206 enables the circuit 200 to have a smaller footprint than a comparable circuit with all the transistors formed in a common plane.

As described above, the layer of the InGaN 218 and the associated transistors 220 are formed during the BEOL phase of device fabrication (i.e., after at least some of the metal wiring 214 has been formed). As such, to avoid the degradation of the metal wiring 214, the InGaN 218 is formed using processes that maintain a temperature below about 400° C. In some examples, the InGaN 218 is formed using plasma MBE and $NH_3$-MBE. The particular ratio of In to Ga in the layer of InGaN 218 may be adapted to the particular application for which the transistors 220 are to be used, subject to the temperature limitations to form such transistors. For example, a greater proportion of Ga will result in greater power efficiency in the transistors while a greater proportion of In will result in lower temperatures needed when forming the InGaN 218 epitaxial layer.

In the illustrated example, while the transistors 206 formed on the Si substrate 202 include the fin 211, the transistors 220 formed on the InGaN 218 are planar transistors with a generally flat surface having a polarization layer on which a gate 224 is formed. However, it may be possible to form the transistors 220 with different designs and/or shapes. For example, doped regions (or etched and regrown regions) may be formed in the InGaN to serve as the source and drain for the transistors 220.

In the illustrated example, the dielectric material 216 is an amorphous or non-crystalline material. As a result, the InGaN 218 formed on the dielectric material 216 will typically not be fully crystalline as is commonly desired in semiconductor substrates for transistors. That is, GaN, InN, and other such semiconductor materials are typically formed on an underlying crystalline substrate (e.g., silicon carbide (SiC), sapphire ($Al_2O_3$), etc.) to ensure that the resulting epitaxial layer is as nearly fully crystalline as possible. However, due to the amorphous dielectric material 216 serving as the underlying surface for the InGaN 218 in the illustrated example, the resulting layer of InGaN 218 will be characterized by an amorphous or polycrystalline structure.

While crystallographic defects in a semiconductor are undesirable in a substrate for transistors used for the fast logic desired in a microprocessor, performance concerns are somewhat reduced when the semiconductor is used for control logic applications such as circuits providing voltage regulation or RF power amplification as mentioned above. That is, while the polycrystalline nature of the InGaN 218 may result in some reduction in the breakdown voltage of the material relative to a fully crystalline layer, the significantly higher bandgap of InGaN than Si is such that the transistor 220 formed on the InGaN 218 will still provide significant improvements in power efficiency over a transistor formed on a traditional Si substrate. Furthermore, a thickness 226 of the layer of the InGaN 218 can be much thinner than in other semiconductor applications of GaN because the need to reduce defects (with a thick epitaxial layer) is not a concern. For example, many known applications of GaN use layers that are on the order of approximately 3 micrometers thick. By contrast, in some examples, the thickness 226 of the InGaN 218 in FIG. 2 may be less than or equal to approximately 0.1 micrometers (100 nanometers). In some examples, the thickness 226 of the InGaN 218 may be less than or equal to approximately 30 nanometers. The much thinner layer of the InGaN 218, due to the lack of concern for the crystalline structure of the InGaN 218, enables the transistor 220 on the InGaN 218 to be placed within the metallization layers during the BEOL processing such that a height difference 228 between the top surface 204 of the Si substrate 202 and a top surface 230 is less than 1 micrometer. In some examples, the height difference 228 may be significantly less (e.g., ranging between 0.1 and 0.5 micrometers). The close proximity of the transistors 206, 220 greatly facilitates their electrical interconnection of the transistors via the metal wiring 214 and increases the transistor density of the electric circuit 200.

While FIG. 2 illustrates the integration of GaN-based transistors and Si transistors on a single silicon wafer, the teachings disclosed herein may be suitably adapted to other semiconductor materials as well. For example, rather than Si, the underlying substrate (i.e., the base wafer) could alternatively be made of germanium (Ge), gallium arsenide (GaAs), silicon germanium (SiGe), or any other suitable semiconductor. Further, different materials may be used for the transistors formed during BEOL processing other than GaN so long as the materials are capable of being formed within acceptable temperature limits for the BEOL (e.g., below 400° C.). For example, other III-N semiconductors that include indium (e.g., indium aluminum nitride (AlN)) may be used instead of the InGaN described above.

Figure 3:
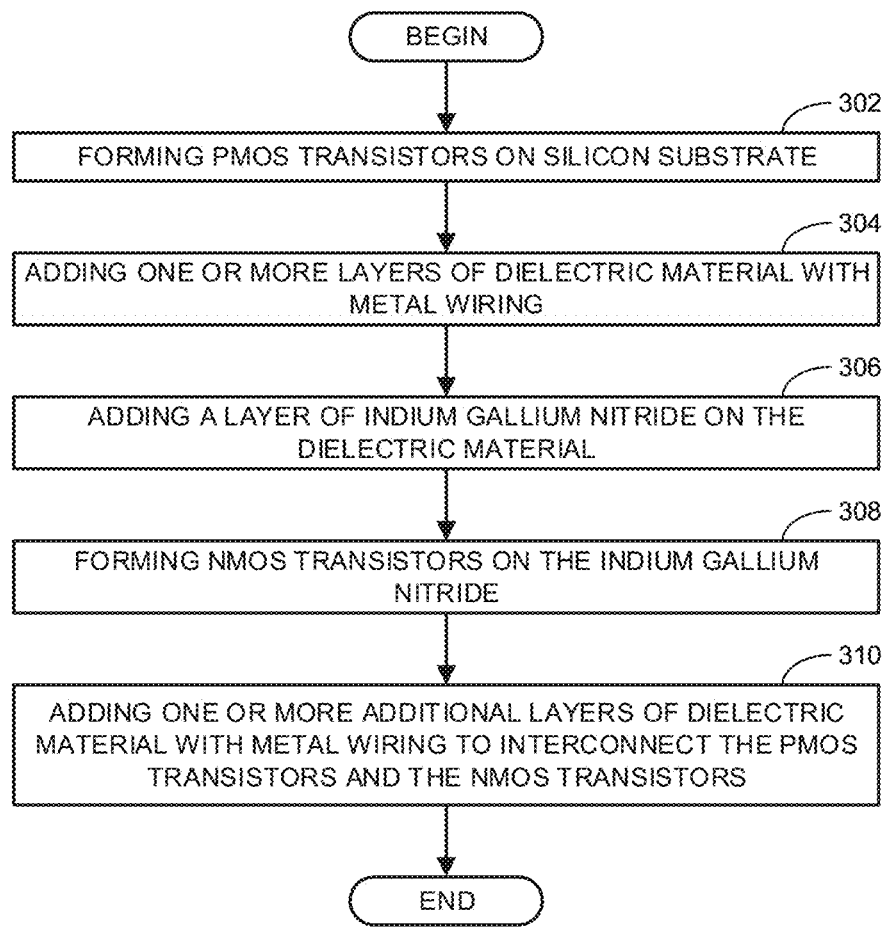
FIG. 3 is a flowchart of an example method to manufacture the example circuit of FIG. 2.

FIG. 3 is a flowchart of an example method to manufacture the example circuit 200 of FIG. 2. The method begins at block 302 where PMOS transistors 206 are formed on a silicon (Si) substrate 202. At block 304, the method involves adding one or more layers of dielectric material 216 with metal wiring 214. The dielectric material 216 may cover or insulate the PMOS transistors 206 while the metal wiring 214 is electrically connected to the source and drain of each transistor 206. At block 306, the method involves adding a layer of indium gallium nitride (InGaN) 218 on the dielectric material 216. As described above, the process to grow the InGaN 218 may be limited to temperatures below about 400° C. to avoid degradation of the metal wiring 214 that has already been deposited (at block 304). In some examples, as shown in FIG. 2, the formation of the InGaN 218 is limited to one or more particular portions of the underlying layer of dielectric material 216 that are spaced apart from the metal wiring 214. The remaining portions of the underlying dielectric material 216 may be covered with additional dielectric material 216 and/or additional metal wiring 214.

At block 308, the example method involves forming NMOS transistors 220 on the InGaN 218. The NMOS transistors 220 are high voltage transistors due to the electrical properties of the GaN materials in the layer of InGaN 218. At block 310, the example method involves adding one or more additional layers of dielectric material 216 with metal wiring 214 to interconnect the PMOS transistors 206 and the NMOS transistors 220. Thereafter, the example method of FIG. 3 ends. Although the example method is described with reference to the flowchart illustrated in FIG. 3, many other methods of manufacturing the example circuit 200 in accordance with the teachings disclosed herein may alternatively be used. For example, the order of execution of the blocks may be changed, and/or some of the blocks described may be changed, eliminated, or combined. Similarly, additional operations may be included in the manufacturing process before, in between, or after the blocks shown in FIG. 3. In particular, in some examples, there may be multiple layers of InGaN 218 added to different layers of the dielectric material 216 such that there are three or more different layers of transistors that are overlapping one another at different levels.

Figure 4:
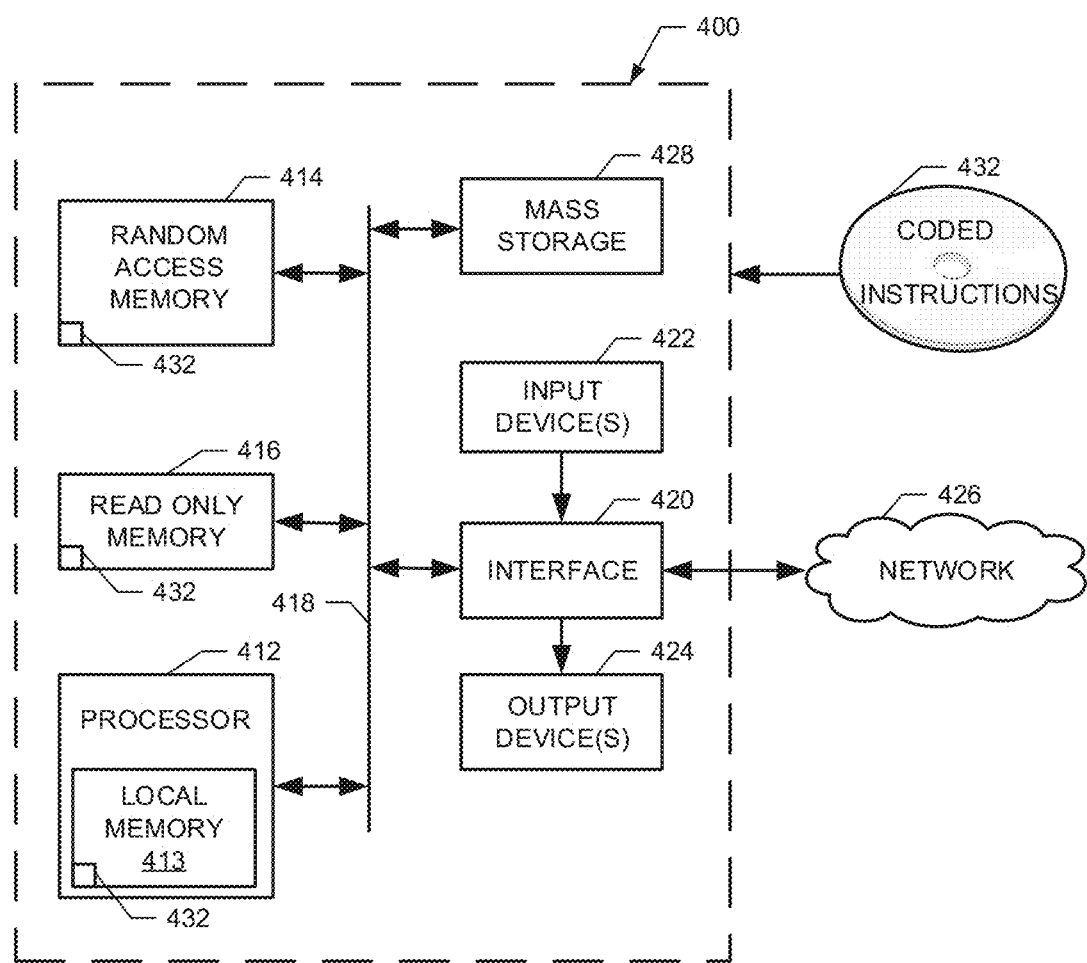
FIG. 4 is a block diagram of an example processor system associated with a semiconductor fabrication machine to execute example machine readable instructions represented at least in part by the example method of FIG. 3 to manufacture the example integrated circuit of FIG. 2.

FIG. 4 is a block diagram of an example processor platform 400 of a semiconductor fabrication machine capable of executing the method of FIG. 3 to manufacture the integrated circuit 200 of FIG. 2. The processor platform 400 can be, for example, a server, a personal computer, a mobile device (e.g., a cell phone, a smart phone, a tablet such as an iPad™), a personal digital assistant (PDA), an Internet appliance, or any other type of computing device.

The processor platform 400 of the illustrated example includes a processor 412. The processor 412 of the illustrated example is hardware. For example, the processor 412 can be implemented by one or more integrated circuits, logic circuits, microprocessors or controllers from any desired family or manufacturer.

The processor 412 of the illustrated example includes a local memory 413 (e.g., a cache). The processor 412 of the illustrated example is in communication with a main memory including a volatile memory 414 and a non-volatile memory 416 via a bus 418. The volatile memory 414 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 416 may be implemented by flash memory and/or any other desired type of memory device. Access to the main memory 414, 416 is controlled by a memory controller.

The processor platform 400 of the illustrated example also includes an interface circuit 420. The interface circuit 420 may be implemented by any type of interface standard, such as an Ethernet interface, a universal serial bus (USB), and/or a PCI express interface.

In the illustrated example, one or more input devices 422 are connected to the interface circuit 420. The input device(s) 422 permit(s) a user to enter data and commands into the processor 412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 424 are also connected to the interface circuit 420 of the illustrated example. The output devices 424 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 420 of the illustrated example, thus, typically includes a graphics driver card, a graphics driver chip or a graphics driver processor.

The interface circuit 420 of the illustrated example also includes a communication device such as a transmitter, a receiver, a transceiver, a modem and/or network interface card to facilitate exchange of data with external machines (e.g., computing devices of any kind) via a network 426 (e.g., an Ethernet connection, a digital subscriber line (DSL), a telephone line, coaxial cable, a cellular telephone system, etc.).

The processor platform 400 of the illustrated example also includes one or more mass storage devices 428 for storing software and/or data. Examples of such mass storage devices 428 include floppy disk drives, hard drive disks, compact disk drives, Blu-ray disk drives, RAID systems, and digital versatile disk (DVD) drives.

Coded instructions 432 to implement the method of FIG. 3 may be stored in the mass storage device 428, in the volatile memory 414, in the non-volatile memory 416, and/or on a removable tangible computer readable storage medium such as a CD or DVD.

From the foregoing, it will be appreciated that the above disclosed methods, apparatus and articles of manufacture enable the use of high voltage transistors formed on a GaN-based semiconductor substrate, which provide benefits in various applications including voltage regulation and RF power amplification. More particularly, the teachings of this disclosure enable the advantages of GaN-based NMOS transistors while avoiding the poor performance characteristics of GaN-based PMOS transistors by co-integrating GaN NMOS transistors with PMOS transistors formed on a different semiconductor substrate. Further, the co-integration of these different transistors is fabricated on a single wafer to facilitate and streamline the production of complete circuits on a single chip, rather than needing to stack independently manufactured chips together. This is accomplished by forming the NMOS transistors after commencing the BEOL processing of adding metal wiring to the previously formed PMOS transistors. More particularly, the NMOS transistors are formed on top of a layer of dielectric material deposited on top of the PMOS transistors. This enables the NMOS and PMOS transistors to be in close proximity to facilitate their electrical interconnection and also reduces the overall footprint of the circuit because the transistors are stacked on top of each other.

Example 1 includes an integrated circuit that includes a first transistor formed on a first semiconductor substrate. The integrated circuit includes a dielectric material formed on the first semiconductor substrate. The dielectric material extends over the first transistor. The integrated circuit further includes a second semiconductor substrate formed on the dielectric material. The integrated circuit includes a second transistor formed on the second semiconductor substrate.

Example 2 includes the subject matter of Example 1, wherein the integrated circuit further including metal wiring to electrically interconnect the first and second transistors.

Example 3 includes the subject matter of any one of Examples 2, wherein the second transistor is formed after at least some of the metal wiring is formed.

Example 4 includes the subject matter of any one of Examples 1-3, wherein the second semiconductor substrate is formed at a temperature less than about 400 degrees Celsius.

Example 5 includes the subject matter of any one of Examples 1-4, wherein the first semiconductor substrate is silicon.

Example 6 includes the subject matter of any one of Examples 1-5, wherein the second semiconductor substrate is formed of one of an amorphous material or a polycrystalline material.

Example 7 includes the subject matter of any one of Examples 1-6, wherein the second semiconductor substrate is indium gallium nitride.

Example 8 includes the subject matter of any one of Examples 1-7, wherein the first transistor is a PMOS transistor and the second transistor is an NMOS transistor.

Example 9 includes the subject matter of any one of Examples 1-8, wherein the integrated circuit is used for voltage regulation.

Example 10 includes the subject matter of any one of Examples 1-9, wherein the integrated circuit is used for radio frequency power amplification.

Example 11 includes an apparatus that includes a first transistor and a second transistor electrically interconnected to the first transistor. The first and second transistors are formed on a single semiconductor wafer. The second transistor is formed after formation of metal wiring used to interconnect the first and second transistors.

Example 12 includes the subject matter of Example 11, wherein the second transistor is above the first transistor.

Example 13 includes the subject matter of any one of Examples 11 or 12, wherein the apparatus further includes a layer of a dielectric material on the semiconductor wafer. The apparatus also includes a layer of a gallium nitride-based material on the dielectric material. The layer of the gallium nitride-based material corresponds to a substrate for the second transistor.

Example 14 includes the subject matter of Example 13, wherein the gallium nitride-based material includes indium.

Example 15 includes the subject matter of any one of Examples 11-14, wherein the second transistor is formed at a temperature less than or equal to 400 degrees Celsius.

Example 16 includes a method to manufacture an integrated circuit that includes forming a first transistor on a first semiconductor substrate. The method further includes adding a layer of a dielectric material after formation of the first transistor. The method also includes forming a second transistor on the dielectric material.

Example 17 includes the subject matter of Example 16, wherein the method further includes adding a layer of a second semiconductor material on the dielectric material. The method further includes forming the second transistor on the second semiconductor material.

Example 18 includes the subject matter of Example 17, wherein the second semiconductor material is indium gallium nitride.

Example 19 includes the subject matter of any one of Examples 17 or 18, wherein adding the layer of the second semiconductor material is completed at a temperature not exceeding 400 degrees Celsius.

Example 20 includes the subject matter of any one of Examples 16-19, wherein the method further includes forming metal wiring to electrically interconnect the first transistor to the second transistor.

Example 21 includes the subject matter of Example 20, wherein at least some of the metal wiring is formed prior to forming the second transistor.

Example 22 includes the subject matter of any one of Examples 16-21, where the first transistor is a PMOS transistor and the second transistor is an NMOS transistor.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An integrated circuit comprising:
   a first transistor on a first semiconductor material comprising a fin;
   an amorphous dielectric material on the first semiconductor material and extending over the first transistor;
   a second semiconductor material on the amorphous dielectric material, the second semiconductor material comprising a polycrystalline or amorphous alloy of indium, gallium, and nitrogen; and
   a second transistor on the second semiconductor material, wherein the second transistor comprises a planar transistor.

2. The integrated circuit of claim 1, further comprising metal wiring to electrically interconnect the first and second transistors.

3. The integrated circuit of claim 2, wherein the metal wiring and the amorphous dielectric material comprises a series of layers of the amorphous dielectric material and layers of the metal wiring.

4. The integrated circuit of claim 3, wherein the second transistor is within the layers of the metal wiring.

5. The integrated circuit of claim 1, wherein the first semiconductor material comprises silicon.

6. The integrated circuit of claim 1, wherein the second semiconductor material has a thickness of not more than 100 nanometers.

7. The integrated circuit of claim 1, wherein the second semiconductor material has a thickness of not more than 30 nanometers.

8. The integrated circuit of claim 7, wherein a height difference between a top surface of the first semiconductor material and a top surface of the second semiconductor material is not more than 0.5 microns.

9. The integrated circuit of claim 1, wherein the first transistor is a PMOS transistor and the second transistor is an NMOS transistor.

10. An apparatus comprising:
    a battery; and
    a circuit coupled to the battery, the circuit comprising:
       a first transistor on a first semiconductor material comprising a fin;
       an amorphous dielectric material on the first semiconductor material and extending over the first transistor;
       a second semiconductor material on the amorphous dielectric material, the second semiconductor material comprising a polycrystalline or amorphous alloy of indium, gallium, and nitrogen; and
       a second transistor on the second semiconductor material, wherein the second transistor comprises a planar transistor.

11. The apparatus of claim 10, further comprising metal wiring to electrically interconnect the first and second transistors, wherein the metal wiring and the amorphous dielectric material comprises a series of layers of the amorphous dielectric material and layers of the metal wiring, and wherein the second transistor is within the layers of the metal wiring.

12. The apparatus of claim 10, wherein the second semiconductor material has a thickness of not more than 30 nanometers.

13. The apparatus of claim 12, wherein a height difference between a top surface of the first semiconductor material and a top surface of the second semiconductor material is not more than 0.5 microns.

14. The apparatus of claim 10, wherein the first transistor is a PMOS transistor and the second transistor is an NMOS transistor.

15. A method to manufacture an integrated circuit, comprising:
    forming a first transistor on a first semiconductor material comprising a fin;
    adding an amorphous dielectric material on the first semiconductor material and extending over the first transistor
    forming a second semiconductor material on the amorphous dielectric material, the second semiconductor material comprising a polycrystalline or amorphous alloy of indium, gallium, and nitrogen; and forming a second transistor on the second semiconductor material, wherein the second transistor comprises a planar transistor.

16. The method of claim 15, wherein the second semiconductor material has a thickness of not more than 30 nanometers and a height difference between a top surface of the first semiconductor material and a top surface of the second semiconductor material is not more than 0.5 microns.

17. The method of claim 16, wherein the second semiconductor material has a thickness of not more than 100 nanometers.

18. The method of claim 16, wherein adding the amorphous dielectric material, forming the second semiconductor material, and forming the second transistor are completed at a temperature not exceeding 400 degrees Celsius.

19. The method of claim 15, further comprising forming metal wiring to electrically interconnect the first transistor to the second transistor.

20. The method of claim 19, wherein at least some of the metal wiring is formed prior to forming the second transistor.

21. The method of claim 15, where the first transistor is a PMOS transistor and the second transistor is an NMOS transistor.

* * * * *